United States Patent

Van Boxem

[11] Patent Number: 5,943,237
[45] Date of Patent: Aug. 24, 1999

[54] METHOD AND SYSTEM FOR ASSESSING A MEASUREMENT PROCEDURE AND MEASUREMENT-INDUCED UNCERTAINTIES ON A BATCHWISE MANUFACTURING PROCESS OF DISCRETE PRODUCTS

[75] Inventor: Gerardus J. C. Van Boxem, Nijmegen, Netherlands

[73] Assignee: U.S. Philips Corporation, New York, N.Y.

[21] Appl. No.: 08/951,880

[22] Filed: Oct. 17, 1997

[30] Foreign Application Priority Data

Oct. 21, 1996 [EP] European Pat. Off. ............. 96202901

[51] Int. Cl.[6] .................. G06F 15/00; G06G 7/48
[52] U.S. Cl. ............... 364/468.15; 364/578; 364/490
[58] Field of Search ................ 364/468.15, 148.06, 364/468.16, 468.26, 468.17, 578, 490, 151

[56] References Cited

U.S. PATENT DOCUMENTS

| | | | |
|---|---|---|---|
| 5,197,011 | 3/1993 | Biemans et al. | 364/468 |
| 5,399,531 | 3/1995 | Wu | 364/468.28 |
| 5,408,405 | 4/1995 | Mozumder et al. | 364/468 |
| 5,646,870 | 7/1997 | Krivokapic et al. | 364/578 |
| 5,655,110 | 8/1997 | Krivokapic et al. | 364/578 |
| 5,761,064 | 6/1998 | La et al. | 364/468.17 |

OTHER PUBLICATIONS

"Successful Implementation of SPC in Semiconductor Final Test", by Sarkis Ourfalian; Analog Devices, Inc., Wilmington, MA; Int'l Test Conf. 1992; pp. 275–282.

"Statistical Process Control, the CQM Approach"; by Does, et al; Jan. 1992; pp. 1–44.

*Primary Examiner*—William Grant
*Assistant Examiner*—Carolyn T. Baumgardner
*Attorney, Agent, or Firm*—Brian J. Wieghaus

[57] ABSTRACT

In the testing of certain discrete devices, such as integrated circuits, it has been found that variations in measurements are often caused by error terms from the measurement equipment and process. The invention provides a statistical process control (SPC) method and apparatus that determines the errors introduced by the measurement equipment and process. Statistical processes are provided to compensate for these errors and improve the accuracy of the testing process. The measurement errors are based upon repeated independent measurements of select parameters of each unit tested.

7 Claims, 4 Drawing Sheets

METHOD AND SYSTEM FOR ASSESSING A MEASUREMENT PROCEDURE AND MEASUREMENT-INDUCED UNCERTAINTIES ON A BATCHWISE MANUFACTURING PROCESS OF DISCRETE PRODUCTS

BACKGROUND OF THE INVENTION

1. Field of the Invention

The invention relates to a method for assessing a measurement procedure on a batchwise executed manufacturing process of discrete products, inclusive of assessing measurement-induced uncertainties pertaining to the procedure.

2. Description of the Related Art

A typical such product is an electronic integrated circuit, that is manufactured in multiple batches and needs a long sequence of product steps, inclusive of process-oriented steps, mechanical handling-oriented steps, such as bonding, and test-oriented steps. The cost layout of such a circuit is a steep function of the number of successive steps actually performed. Therefore, a great need exists for rejecting out-of-limits products in an early manufacturing state, while as much as possible avoiding any unbased such rejection. Earlier procedures for monitoring the measuring process used reference products with known properties, and also, reference interfaces, reference handlers, and reference testers. The use of such facilities necessitated the setting up of a special measuring site for measuring statistical process parameters. Moreover, the references were often variable in the course of time.

BRIEF SUMMARY OF THE INVENTION

In consequence, among other things, it is an object of the present invention to systematically treat the spread in parameter values measured on various levels of organization. Further, the measurements should be effected on-line during the manufacturing process while using both the standard equipment of the testing, and further exclusively samples taken from the actual product batch, thereby avoiding any disturbance in the normal product flow.

The invention can be applied on integrated electronic circuits that come in batches which typically comprise several tens of wafers, each wafer typically comprising hundreds to thousands of individual circuits. Advantageously, each parameter measurement is accompanied by a pass-fail decision of the product item in question. Such rejected item then will no longer have a detrimental effect on the processing of other measurements.

The invention also relates to an apparatus for implementing the method.

BRIEF DESCRIPTION OF THE SEVERAL VIEWS OF THE DRAWINGS

The invention is explained in further detail, and by way of example, with reference to the accompanying drawings that show.

DETAILED DESCRIPTION OF THE INVENTION

Various advantageous aspects of the invention are as follows:

All influences of the actual situation are taken into account. The whole manufacturing configuration is kept constant, such as pertaining to tester, product handler, and interface, that comprises the contacting needles and the immediate capture of the signals. Therefore, the influence of these factors on the measuring process is exactly and truly monitored.

Also the physical access, such as through probes or needles, is monitored, in that repeated accessing of a single product item through a handler also monitors the contacting quality. Note that changing the product type also may influence the part of the parameter values that depends on such contacting. The monitoring is batch-independent. Earlier methods would monitor type parameter values, in addition to measuring yield percentages of the manufacturing, and bin information, the latter indicating the sorting of the items into various bins, to a good/faulty characterization, and possibly, further according to some analog property, such as the maximum operable clock frequency of a processor. These by itself are conventional quantities, see the reference on statistical parameter control. However, inter-batch variance is higher than intra-batch variance; moreover, in-batch variance between various items is higher than inter-measurement variance between successive measurements on the same item. The consequence is that the above could not yield adequate policy data for monitoring the overall process. The assumption of a repeatability quality as an elementary yardstick for quality, the problems sketched have been surmounted.

The feedback time is extremely short. Because the effects of the measurement proper can be considered in isolation, the operator can conclude whether a problem is caused by the measuring process itself. Only if this is not the case, the product type itself will be the cause. In the present set-up, the latter determination can be done by a non-specialized operator.

The measurement process has been standardized as follows. During the measurement on a batch of products, the products are divided in groups of 800 to 2000, depending on the type. Within each group a selection of 40 products is measured two times each, inclusive of repeated contacting and releasing. Next, the selection-wise average difference is calculated between the first measurement and the second measurement for each individual product. These data are subjected to SHEWHART test. If such test issues a warning signal, the tester is stopped, whereupon the operator can start an 'out of control action plan' (OCAP) phase. The preferred fields of application are the measuring of analog quantities on IC's and the in-line measuring of printed circuit boards.

Figure 1:
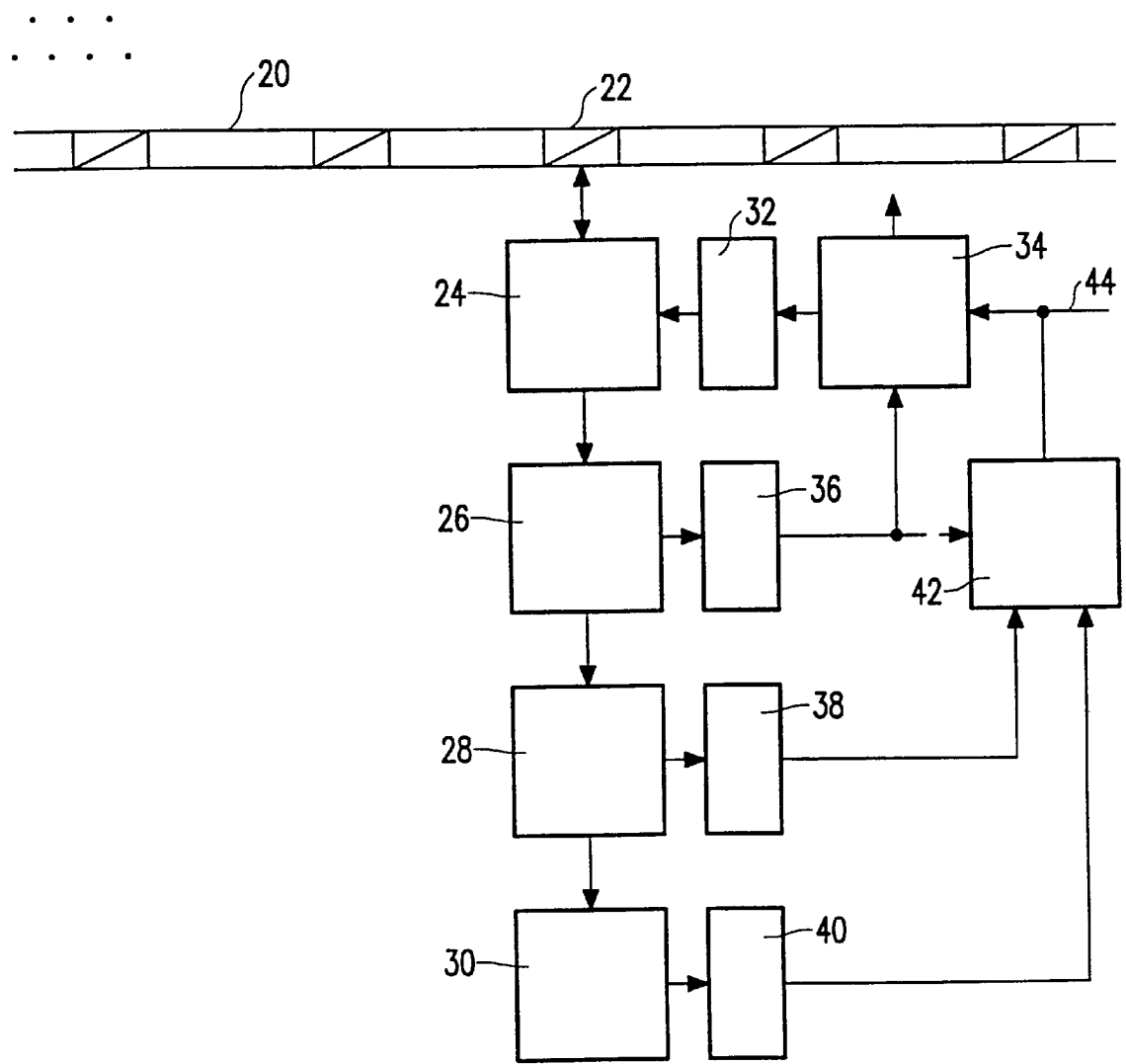
FIG. 1, a device set-up according to the invention.

FIG. 1 is a block diagram of a device set-up according to the invention. Strip 20 symbolizes a stream of batch-wise manufactured products; the products are symbolized as small blocks, such as block 22. The products may actually be moving in time, or rather be located in fixed disposition with respect to each other on an integrated circuit wafer. In integrated circuit production, a batch may be defined as comprising several tens of wafers. A single wafer may then be defined as a sub-batch. For other products, the mapping can be appropriate. The remainder of the Figure pertains to the measurement and control process. Block 24 is the measurement handler that can manipulate a particular product and access it, such as with measurement pins or non-contact probes. Actual accessing is governed by access control module 32. Overall control of the manufacturing and measurement process is by overall control module 34. This may control manufacturing steps, transport steps, and measurement steps. An overall workstation has been disclosed in U.S. Pat. No. 5,197,011 (PHN 12936) to the present assignee. A particular product such as item 22 is accessed repeatedly by access module 24 for thereby deriving measured parameter values. The nature of the parameter values, such as voltage, resistance, capacitance, and other parameters that may be assessed in a non-destructive manner can be various. The parameter values as measured are forwarded to first staticizing module 26 that for each respective product item and each respective parameter thereof calculates averages of the various values, as well as spread values and possibly other statistical properties, such as covariances. As will be discussed infra, the statistical product control measures are based on a relatively small selection from all product items. For the latter data, the first staticizing also includes calculating the average parameter spread of a subbatch.

The product-wise values, as well as their averages are forwarded to first analyzing module 36, that upon getting particular analysis results may signal to overall control module 34 that a particular product item is defective, and should not be used further. This item is then visibly marked. If appropriate, operator console 42 may get a signal that for the operator such as a warning or other signal that characterizes the manufacturing process.

With respect to the execution of the statistical product control (SPC) measures, the selected average and spread values are also forwarded to second staticizing module 28 that calculates mean averages, and possibly, other statistically relevant aspects for corresponding parameters of various products over a whole batch. These quantities are forwarded to second analyzing module 38, that according to a further strategy description may send warning and other signals to operator console 42. The batchwise spread values thus calculated are also forwarded to third staticizing module 30, that calculates further statistically relevant quantities across multiple batches of products and sends the results so gained to third analyzing module 40. The latter, according to a still further strategy may send warning and other relevant signals to operator control module 42. From operator console 42, manufacturing parameters and other relevant quantities may be controlled along bidirectional arrow 44. The console also knows the begin and end of batches, which is signalled by block 34, so that the interaction may be effected at an appropriate instant, such as at the beginning of a new batch. The spread data produced by the successive staticizing operations may in console 42 be used for implementing statistical control measures. For one, such measure may be to in anticipation stop the manufacturing future out-of-limit products, so that an operator person may adjust certain process parameters.

Figure 2:
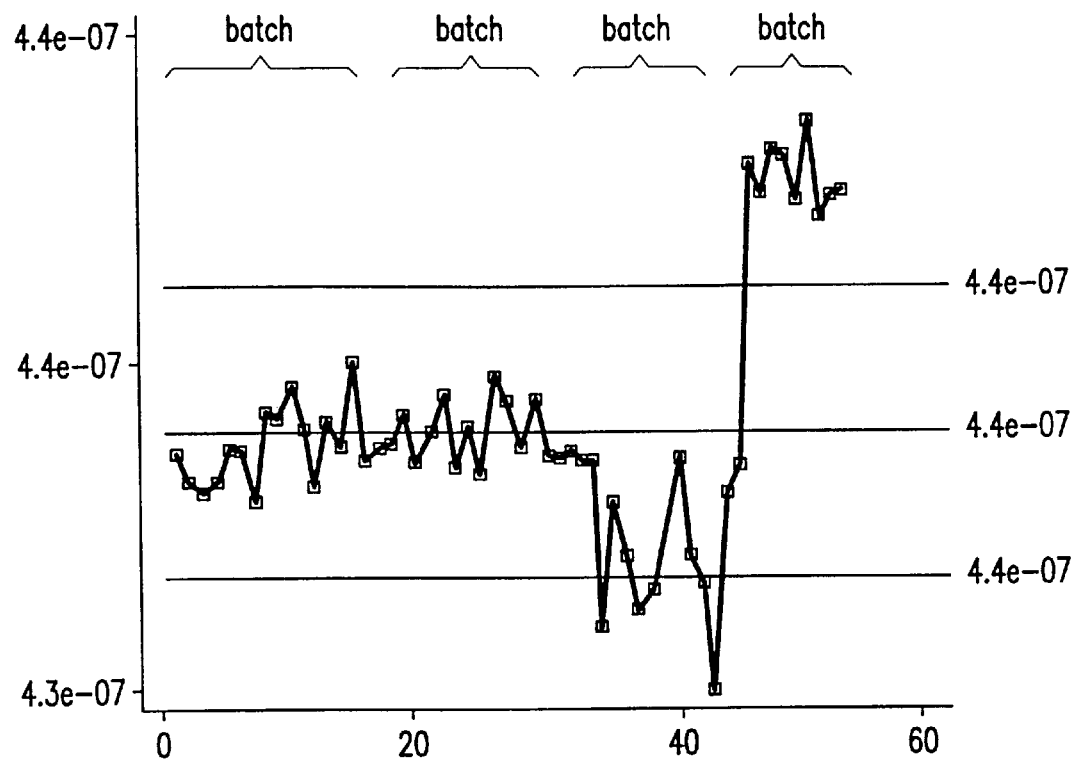
FIG. 2, measured parameter values.

FIG. 2 shows a series of measured parameter values, each entry in the Figure representing an averaged measurement value on a subbatch. At the top of the Figure, the association of the various measuring instants to the respective batches is shown. As shown, the first two batches have similar averages; the third one appears to be lower, whereas the fourth one appears to be higher. A particular question now is whether the variation between the batches would warrant to take interactive measures on the manufacturing process, or rather not.

Figure 3:
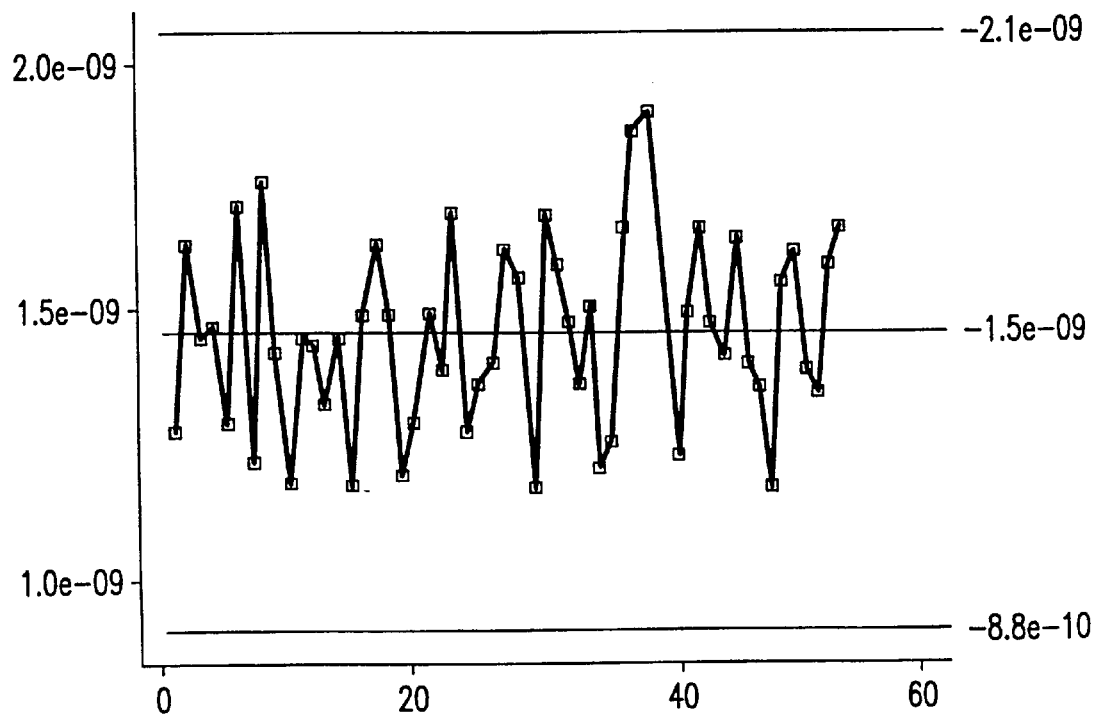
FIG. 3, measured repeatability values.

FIG. 3 shows measured repeatability values as derived from the basic data of FIG. 2. From the various entries in the chart, it is clear that there is no correlation by negative influences between the various batches, so that no reason exists for undertaking corrective measures. This conclusion is drawn by the standard procedures of the statistical process control.

The novel monitor for the error sources of the test process thus presented has been found to be independent of the tested product; it does not disturb the production flow. It can be used to control the test process during production (SPC). Generally, production-testing is done for all wafers produced, but in pilot production for final encapsulated products as well. Most products are linear, although digital/mixed signal is increasing. Linear/mixed signal products are mainly tested on parametric values. Upon finding contacting problems, further analysis of the parametric test process is done.

Analysis of the parametric test process

Figure 4:
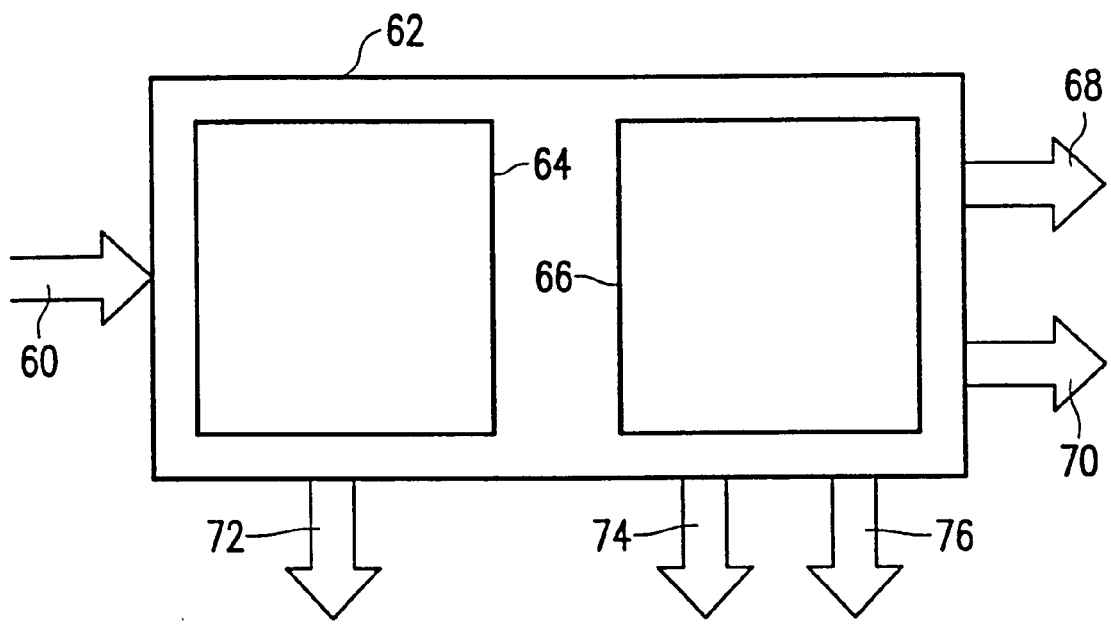
FIG. 4, product and information flow of the process.

FIG. 4 shows product and information flows in a test factory 62. Untested products arrive at 60. The process consists of measuring the product specifications 64, and the check against product specification limits 66. The outcomes are 'good' products 68, rejected products 70, product parameter distributions with respect to level and dispersion 72, rejects per test 74, and yield 76, the latter three being information only.

Figure 5:
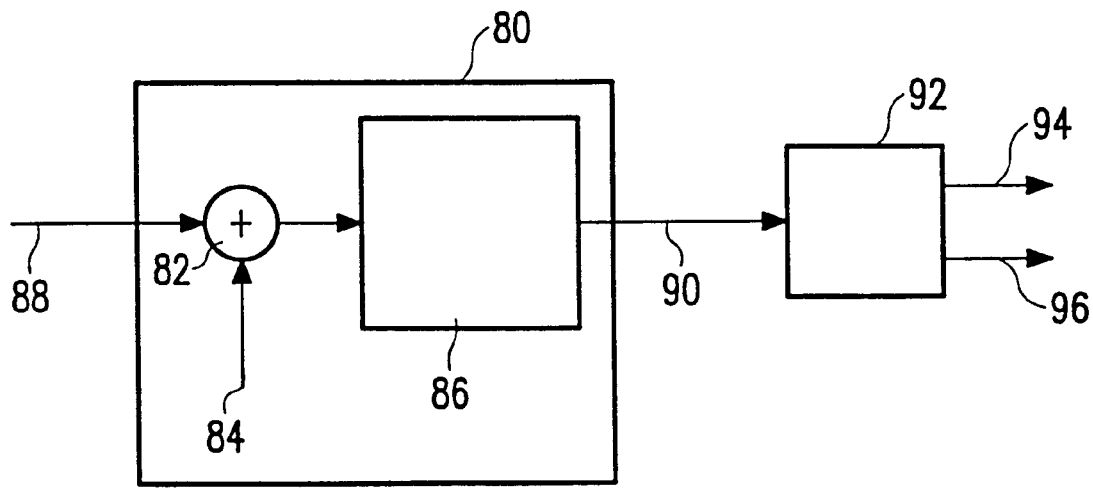
FIG. 5, signal flow for a measured parameter Pi.

FIG. 5 shows the signal flow for a parametric test. While measuring a particular parameter Pi 88, an error e (84) is added (82) by the test process 80 itself; this yields the so-called error-free measurement 86. The added value of the test process is information on products: pass/fail, yield, reject parameter distribution etc: the measured value Pm 90 is compared 92 to upper limit UL and lower limit LL. This may result in commanding the next parameter measurement 94, or in reject 96. The added test error "e" is physically quantified in terms of accuracy, repeatability and reproducibility. Error sources are primarily "machines", such as:

tester modules
interface modules
contacting

All error sources are known, and can be taken into account in the design of the test facility. Problem is that they change in time, however.

Current solutions for the main problem of a test factory "how to control the test-error" are regular calibration of tester-interface modules, frequent maintenance, in particular relating to contacts, using standard references (golden devices), and quality acceptance, by re-testing a sample of devices of a production batch. A particular disadvantage of these methods is downtime of manufacturing equipment, due to disturbed production flow.

A more recent solution is to monitor the test-error by using the product information (yield/reject/parameter-level etc.).

Advantage: it can be done during testing of the batch.

Disadvantage: it is insensitive. The most sensitive monitor is the parameter-level of a product. In practice the nature of IC production is such that the product-parameter-variation is much higher than the test-error, so the "test-error noise" disappears in the "product-noise", and only severe problems are detected.

Another disadvantage is that in case an alarm occurs, it is not possible to determine whether the cause is a test problem or a product problem.

Improving control of the test process by a new monitor

Figure 6:
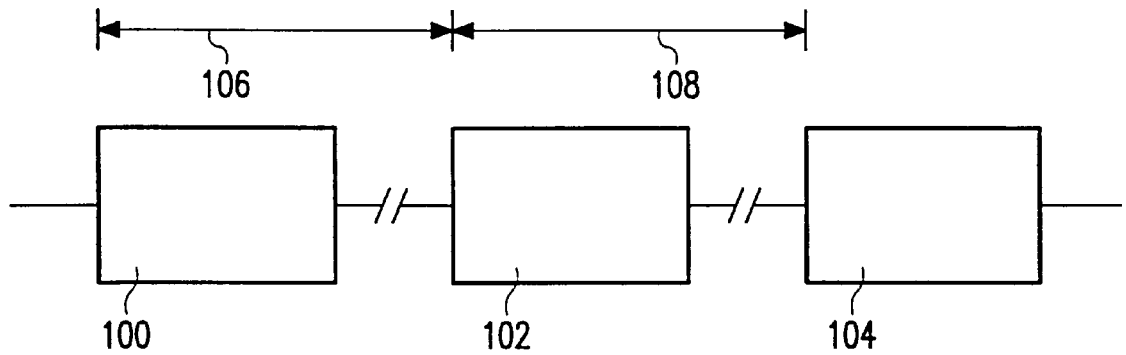
FIG. 6, a test process monitor.

FIG. 6 shows a monitor that is used during production, without disturbing the production flow and independent of the product level.

$P_i$ is the "to-be-measured" product parameter, "s" is the systematic error, "r" is the random error. Basic idea is re-testing: a second measurement ($P^{m2}$) gives the same parametric level $P_i$, but a different random error. In subtracting first and second measurements, the error difference remains, the latter can be used to calculate the repeatability of the error.

Practical formulas are:

$P_{k1}$=first measurement of parameter P of k-th product $P_{k2}$=second measurement of parameter P of k-th product As a measure for the repeatability the "range" R is chosen:

$R_k = |P_{k1} - P_{k2}|$

For a sample of N products, the average range Rav is:

$$Rav = 1/N * \sum_{k=1}^{N} R_k$$

The average parameter-value Pav can be calculated as:

$$Pav = 1/2N * \sum_{k=1}^{N} (P_{k1} + P_{k2})$$

In practice a sample-size of 40 products is taken to achieve a confidence level of 95%. In FIG. 6, of a subbatch or wafer, blocks 100, 102, 104 indicate the samples that are used for determining the parameter values for statistical process control. Note that all chips are measured for pass-fail checking. The subbatch is indicated by arrows 106, 108, and may count some 1000 chips. Each of the 40 devices is measured twice, including recontacting.

Figure 7:
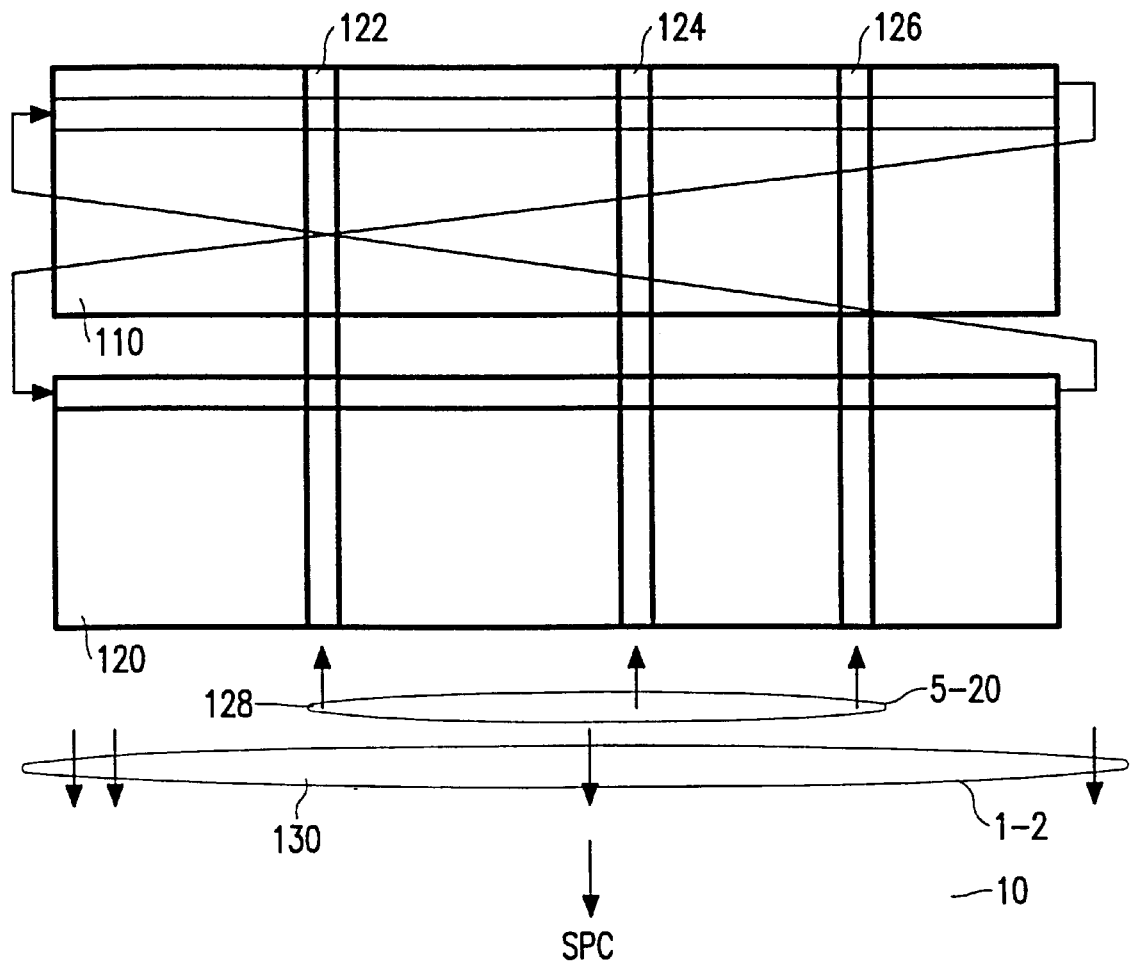
FIG. 7, a hierarchical structure of a measurement.

FIG. 7 shows the hierarchical structure of a measurement. Block 110 symbolizes all parameters measured on each device. Each row represents a single device, that may have some 800 parameters measured, as indicated by the length of a row. All these parameters are taken into account for the pass-fail measurements. Columns 122, 124, 126 symbolize the parameters that are taken into account for finding the spread. Present practice is to take about 5–20 different parameters that have been found to yield the most useful information. Lower block 120 symbolizes the second measurement. This yield the subset of 5–20 parameters, that are found by recontracting between two measurements on the same device as indicated by the hatched areas of block 120. The other parameters of these devices may, or may not be measured a second time. Ellipse 128 indicates the staticizing within a single subbatch. The results thereof are joined with other subbatches of the same batch; the associated staticizing is indicated by ellipse 130. If required, still higher levels of organization may be used. Of course, other sizes of batches, etcetera may be used.

It has been proved that the novel monitor, the average range per sample-number, is indeed independent of the parameter level or value.

Remarks:

The systematic error is not included in this monitor. Experience has shown that a significant change in the systematic error always correlates with a change in the random error.

For practical implementation some handler adaptation is needed to force it to do recontacting of the tested device (controlled by the test program).

Each parametric measurement has its own error-sources. Controlling them all leads to too many monitors and is not useful. The goal is to control only those error-sources for which the product is most sensitive, e.g. a high current product will be more sensitive for contact resistance than a low current product. So selecting these error-sources and the corresponding monitors, can be done separately for each product.

In practice the main error source is contacting, so measurements that are directly related to contacting are selected most frequently. This can be a contact test or an additional specific contact resistance test. Also dynamic measurements that are very sensitive for contacting can be chosen, such as harmonic distortion.

Knowledge for the selection is provided by different disciplines in a test department, such as operator, test developer, equipment operator, factory engineer, and equipment engineer. Putting the monitors so selected in a control-chart and testing against Shewhart rules, makes it possible to detect out-of-control situations, which are solved by doing an "OCAP" (Out Of Control Action Plan), which allows to implement preventive actions.

The "final solution" of an OCAP, the action which is the solution of the out-of-control situation, is called the "terminator". Recording them, together with the causes, gives insight in the weak points of the test process, and a possibility of continuous improvement.

Advantages of SPC on the test process:

For customers optimally tested products
product data is optimally reliable

For test factory:
a tool to check whether testing is correct or not
clear instructions for actions at an optimal level: actions hitherto done by an engineer, can be now be done faster and cheaper by an operator, due to the clear instructions of OCAP optimal—communication between all disciplines
insight in the test process, which makes it more predictable—replacement for QA
decrease downtime by fewer test problems and less re-testing—decrease produce rejects from test problems
less engineering effort The developed software tool builds control charts for every SPG monitor and checks the results against one or more of the 8 Shewhart rules. The test equipment is blocked automatically by this tool if an OCAP situation occurs. It also presents the OCAP's and it records the "OCAP-terminator".

Three typical results are presented. First, the sensitivity for detecting a yield problem using the "repeatability" as monitor versus the "yield" as monitor was checked. Without the first monitor activated, the action took only place at the moment the yield was significant lowered. If the new monitor had been activated, the alarm would have occurred much earlier by activating an appropriate Shewhart rule. This shows that pro-active action is possible.

Using the repeatability of a monitor, occurrence of a certain problem was solved through an OCAP and resulted in a 2% higher pre-test yield. Using yield as monitor, the problem would not have been even detected, because 2% is not detectable within the typical yield variation of a product. So 2% of rejects due to test problems is prevented.

For using the repeatability as monitor, the control limits are set after testing several batches on several testers. At a certain sample, a particular tester is used for the first time. The OCAP was activated and pointed to a tester problem. It took some time to fully solve the problem. In between the tester was used, and the alarm was ignored, after that the problem was solved. This tester problem was not detected by calibration. Generally, reproducibility problems are detected, and in particular also errors undetectable by other methods, such as by calibration.

Based on the experiences expected (quantified) results:

Yield improvement due to fewer test problem rejects: 1%
Decrease test disturbances: 50%
Less re-test & replacement QA: efficiency improvement: 45 minutes per batch.

I claim:

1. A method for assessing a measurement procedure on a batchwise executed manufacturing process of discrete products, inclusive of assessing measurement-induced uncertainties pertaining to said procedure, said method comprising the steps of:

periodically selecting a product item from the batch;

repeatedly accessing each item so selected while in each such access executing a predetermined parameter measurement on the item, for a repeated measurement with respect to one or more selected parameters of each item, from the associated parameter measurements calculating an item spread value;

first staticizing item spread values of a plurality such items with respect to the same parameter(s) for within such batch generating a batch spread value with an associated first confidence level;

second staticizing batch spread values over a plurality of batches for on the basis thereof executing statistical process control.

2. A method as claimed in claim 1, wherein said first staticizing is preceded by initial staticizing item spread values of a plurality such items with respect to the same parameter(s) for within a subbatch of such batch generating a subbatch spread value with an associated second confidence level.

3. A method as claimed in claim 2, wherein said subbatch is an integrated circuit manufacturing wafer.

4. A method as claimed in claim 1, wherein said item is mechanically released and accessed again between measurement pairs of the same parameter.

5. A method as claimed in claim 1, wherein each item has its parameters measured exactly twice.

6. A method as claimed in claim 1, wherein each parameter measurement is accompanied by a pass-fail decision of the product item in question.

7. A system for assessing a measurement procedure on a batchwise executed manufacturing process of discrete products, inclusive of assessing measurement-induced uncertainties pertaining to said procedure, said system comprising:

input means for periodically selecting a product item from the batch;

access and measurement means for repeatedly accessing each item so selected while in each such access executing a predetermined parameter measurement on the item, wherein at least one parameter of said each item is repeatedly measured, calculating means for with respect to the at least one parameter of each item, from the associated repeated parameter measurements calculating an item spread value;

first staticizing means fed by said calculating means for staticizing item spread values of a plurality such items with respect to the same parameter(s) for within such batch generating a batch spread value with an associated first confidence level;

second staticizing means fed by said first staticizing means for staticizing batch spread values over a plurality of batches; and statistical process control means fed by said second staticizing means for on the basis of staticized batch spread values executing statistical process control.

* * * * *